(12) United States Patent
Lee et al.

(10) Patent No.: US 11,393,246 B2
(45) Date of Patent: Jul. 19, 2022

(54) METHOD, APPARATUS, AND COMPUTER-READABLE STORAGE MEDIUM FOR ACQUIRING FINGERPRINT IMAGE

(71) Applicant: Suprema Inc., Seongnam-si (KR)

(72) Inventors: Daehong Lee, Seongnam-si (KR); Hochul Shin, Seongnam-si (KR); Bong Seop Song, Seoul (KR)

(73) Assignee: Suprema Inc., Seongnam-si (KR)

( * ) Notice: Subject to any disclaimer, the term of this patent is extended or adjusted under 35 U.S.C. 154(b) by 0 days.

(21) Appl. No.: 17/370,440

(22) Filed: Jul. 8, 2021

(65) Prior Publication Data

US 2022/0164563 A1   May 26, 2022

(30) Foreign Application Priority Data

Nov. 26, 2020 (KR) .................. 10-2020-0161457

(51) Int. Cl.
| | |
|---|---|
| *G06V 40/12* | (2022.01) |
| *H01L 27/32* | (2006.01) |
| *H03H 17/02* | (2006.01) |
| *G06K 9/62* | (2022.01) |
| *G06V 10/30* | (2022.01) |

(Continued)

(52) U.S. Cl.
CPC ....... *G06V 40/1347* (2022.01); *G06K 9/6215* (2013.01); *G06V 10/30* (2022.01); *G06V 40/1318* (2022.01); *G06V 40/1365* (2022.01); *G06V 40/50* (2022.01); *H01L 27/323* (2013.01); *H01L 27/3234* (2013.01); *H01L 27/3244* (2013.01); *H03H 17/0213* (2013.01)

(58) Field of Classification Search
CPC ............... G06V 40/1347; G06V 10/30; G06V 40/1318; G06V 40/1365; G06V 40/50; G06K 9/6215; H01L 27/323; H01L 27/3234; H01L 27/3244; H03H 17/0213
See application file for complete search history.

(56) References Cited

U.S. PATENT DOCUMENTS

| | | | | |
|---|---|---|---|---|
| 2014/0226879 | A1* | 8/2014 | Westerman | G06V 40/13 382/125 |
| 2014/0270419 | A1* | 9/2014 | Schuckers | G06V 40/1382 382/124 |

FOREIGN PATENT DOCUMENTS

| | | |
|---|---|---|
| KR | 1020110147617 B1 | 4/2013 |
| KR | 1020170146177 A | 12/2018 |
| KR | 1020177023032 A | 12/2018 |

* cited by examiner

*Primary Examiner* — Abhishek Sarma
(74) *Attorney, Agent, or Firm* — Maier & Maier, PLLC

(57) ABSTRACT

A method for acquiring a fingerprint image through a fingerprint image acquisition apparatus is provided. The method includes recognizing a finger of an user through a sensor included in the apparatus to generate an initial input fingerprint image when the finger contacts with a biometric recognition area of the display unit, acquiring a converted fingerprint image by converting the initial input fingerprint image in a pre-determined manner to reveal a characteristic of a pattern, included within the initial input fingerprint image, corresponding to a pattern signal reflected from at least a part of the display unit. The method further includes selecting a pattern removal fingerprint image, if a learned pattern image is stored in a memory, from the learned pattern image based on similarity. The similarity is calculated between the converted fingerprint image and a converted reference image.

20 Claims, 7 Drawing Sheets

(51) Int. Cl.
*G06V 40/50* (2022.01)
*G06V 40/13* (2022.01)

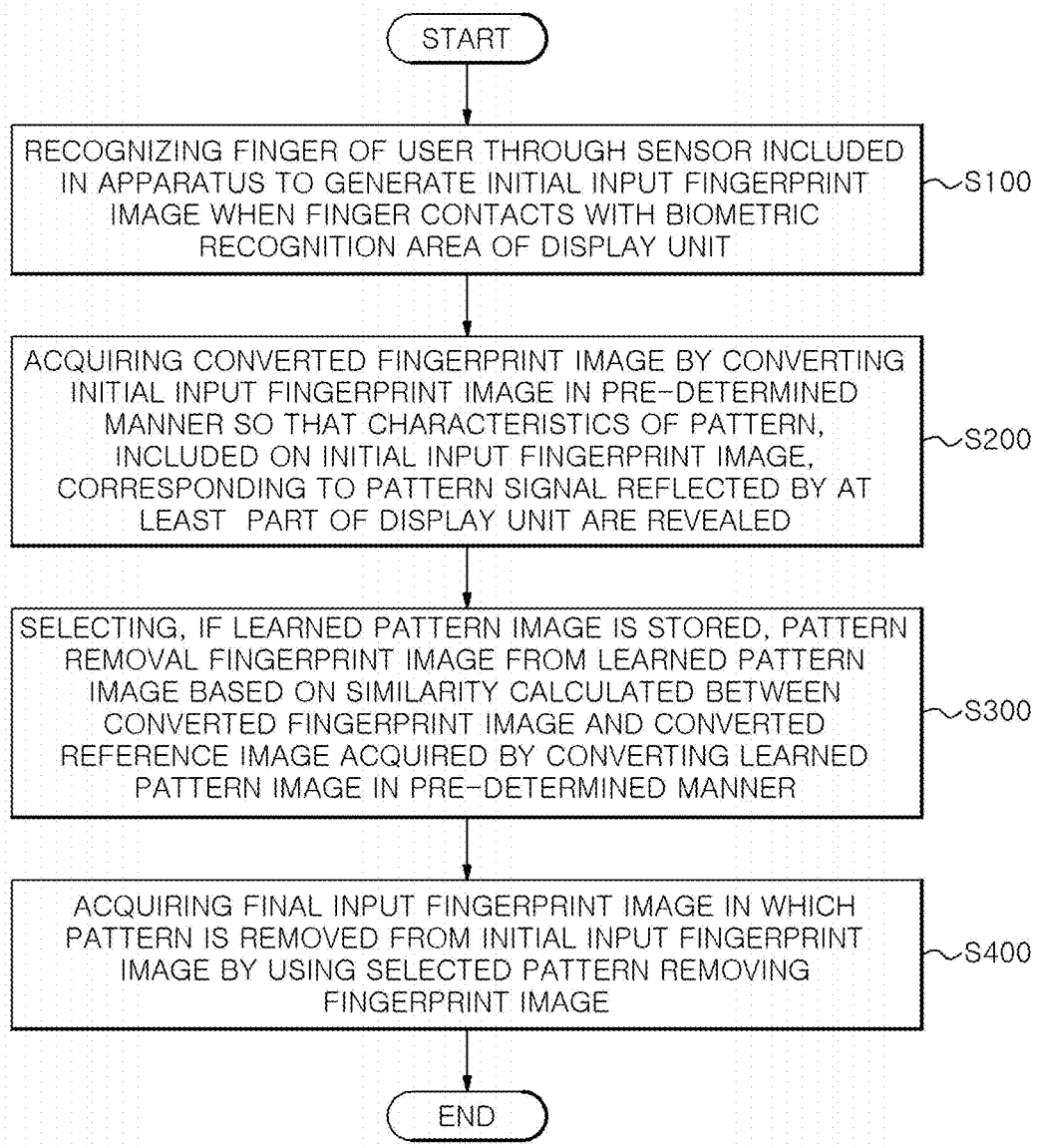

METHOD, APPARATUS, AND COMPUTER-READABLE STORAGE MEDIUM FOR ACQUIRING FINGERPRINT IMAGE

CROSS-REFERENCE TO RELATED APPLICATIONS

This application is based on and claims priority from Korean Patent Application No. 10-2020-0161457, filed on Nov. 26, 2020, the disclosure of which is incorporated herein in its entirety by reference for all purposes.

TECHNICAL FIELD

The present disclosure relates to a fingerprint image acquisition method, a fingerprint image acquisition apparatus and a fingerprint image acquisition computer-readable storage medium.

BACKGROUND

An under-screen optical sensor used to acquire a fingerprint image is provided under a display unit (or a touch screen) of an electronic device to sense light under the display unit, and a fingerprint image acquisition apparatus detects a user's fingerprint contacting with the display unit by using the under-screen optical sensor.

However, the fingerprint image acquired by using the under-screen optical sensor includes not only the user's fingerprint region, but also a pattern corresponding to a pattern signal reflected from a thin film transistor (TFT) included in the display unit.

In particular, because the pattern existing on the fingerprint image acquired by using the under-screen optical sensor has a frequency similar to that of the fingerprint region so that the pattern exists as noise on the fingerprint image, thus the pattern causes a problem of deteriorating performance of fingerprint recognition.

SUMMARY

A problem to be solved by the present disclosure is to provide a fingerprint image acquisition method, a fingerprint image acquisition apparatus, a fingerprint image acquisition computer-readable storage medium, and a fingerprint image acquisition computer program.

In addition, the problem to be solved by the present disclosure is to acquire a final input fingerprint image in which the pattern corresponding to the pattern signal reflected from a TFT is removed from an initial input fingerprint image initially acquired by the fingerprint image acquisition apparatus by using a pre-stored learned pattern image through the fingerprint image acquisition method, the fingerprint image acquisition apparatus, the fingerprint image acquisition computer-readable storage medium, and the fingerprint image acquisition computer program.

In accordance with an aspect of the present disclosure, there is provided a method for acquiring a fingerprint image through a fingerprint image acquisition apparatus provided within a display unit of an electronic device, the method comprises recognizing a finger of an user through a sensor included in the apparatus to generate an initial input fingerprint image when the finger contacts with a biometric recognition area of the display unit, acquiring a converted fingerprint image by converting the initial input fingerprint image in a pre-determined manner to reveal a characteristic of a pattern, included within the initial input fingerprint image, corresponding to a pattern signal reflected from at least a part of the display unit, and selecting a pattern removal fingerprint image, if a learned pattern image is stored in a memory, from the learned pattern image based on similarity calculated between the converted fingerprint image and a converted reference image acquired by converting the learned pattern image in a pre-determined manner and acquiring a final input fingerprint image in which the pattern is removed from the initial input fingerprint image by using the selected pattern removal fingerprint image.

Further, a plurality of learned pattern images may be stored in the memory, the selecting the pattern removal fingerprint image may include calculating each similarity between the converted fingerprint image and each of converted reference images acquired by converting the plurality of the learned pattern images in the pre-determined manner and selecting a learned pattern image having largest similarity with the converted fingerprint image as the pattern removal fingerprint image.

Further, a plurality of learned pattern images may be stored in the memory, the selecting the pattern removal fingerprint image may include calculating similarity between the converted fingerprint image and a converted reference image acquired by converting a most recently used learned pattern image as a previously used pattern removal fingerprint image among the plurality of the learned pattern images and selecting the most recently used learned pattern image as the pattern removal fingerprint image if the calculated similarity exceeds a pre-determined threshold value.

Further, a plurality of learned pattern images may be stored in the memory, the selecting the pattern removal fingerprint image may include calculating similarity between the converted fingerprint image and a converted reference image acquired by converting a most recently used learned pattern image as a previously used pattern removal fingerprint image among the plurality of the learned pattern images, calculating a plurality of similarity between the converted fingerprint image and each converted reference image acquired by converting learned pattern images other than the most recently used learned pattern image among the plurality of the learned pattern images if the calculated similarity is smaller than a pre-determined threshold value and selecting a learned pattern image having the largest similarity among the learned pattern images as the pattern removal fingerprint image.

Further, the method may further comprise reflecting the initial input fingerprint image on the learned pattern image based on a result of comparing a pre-determined threshold value and the similarity between the converted fingerprint image and the converted reference image acquired by converting the learned pattern image in the pre-determined manner.

Further, the reflecting the initial input fingerprint image may include accumulating pixel values corresponding to the initial input fingerprint image on the learned pattern image selected as the pattern removal fingerprint image.

Further, the initial input fingerprint image may further include a fingerprint region, the accumulating the pixel values may include lowering definition of the fingerprint region included on the initial input fingerprint image by a pre-determined amount if the definition of the fingerprint region included on the initial input fingerprint image is greater than pre-determined definition and accumulating the pixel values of the initial input fingerprint image in which the definition of the fingerprint region is lowered on the learned pattern image selected as the pattern removal fingerprint image.

Further, the initial input fingerprint image may further include a fingerprint region and the pixel values may be accumulated on the learned pattern image selected as the pattern removal fingerprint image without lowering definition of the fingerprint region if definition of the fingerprint region is smaller than or equal to a pre-determined definition.

Further, the reflecting the initial input fingerprint image may include adding and storing the initial input fingerprint image as the learned pattern image if the calculated similarity is smaller than or equal to the pre-determined threshold value.

Further, the initial input fingerprint image may further include a fingerprint region, the adding and storing the initial input fingerprint image may include lowering definition of the fingerprint region included on the initial input fingerprint image by a pre-determined amount if the definition of the fingerprint region included on the initial input fingerprint image is greater than pre-determined definition and adding and storing the initial input fingerprint image in which the definition of the fingerprint region is lowered as the learned pattern image.

Further, the initial input fingerprint image may further include a fingerprint region, and the initial input fingerprint image may be added and stored as a learned pattern image without lowering definition of the fingerprint region if the definition of the fingerprint region is smaller than or equal to a pre-determined definition.

Further, the plurality of learned pattern images may be stored in the memory, the reflecting the initial input fingerprint image may include calculating each similarity between the converted fingerprint image and each converted reference image acquired by converting the plurality of the learned pattern images in the pre-determined manner, removing the learned pattern image having the largest similarity if a plurality of the similarity are smaller than or equal to the threshold value and adding and storing the initial input fingerprint image as the learned pattern image.

Further, the acquiring the final input fingerprint image may include acquiring a difference image between the initial input fingerprint image and the pattern removal fingerprint image by using the selected pattern removal fingerprint image and acquiring the final input fingerprint image in which the pattern is removed from the initial input fingerprint image by performing a pre-determined image processing for the difference image.

Further, the pre-determined image processing may be performed by using Low-pass filter or Band-pass filter.

Further, the pre-determined manner to acquire the converted fingerprint image may include converting, by using Fourier Transform, the initial input fingerprint image in a frequency domain of the Fourier transformed initial input fingerprint image and removing a high frequency component from the initial input fingerprint image.

Further, the biometric recognition area may include an OLED display circuit, the pattern signal is a signal reflected from at least a part of the OLED display circuit, and the OLED display circuit includes a Thin Film Transistor (TFT).

Further, the sensor may include an optical sensor, and the display unit includes a touch screen.

Further, the method may further comprise performing user authentication based on a result of comparing the final input fingerprint image and a user authentication fingerprint image in which a fingerprint image of the user is stored.

In accordance with another aspect of the present disclosure, there is provided a fingerprint image acquisition apparatus provided within a display unit of an electronic device comprises a memory configured to store a learned pattern image, a sensor configured to recognize a finger of an user and a processor electrically connected to the memory. The processor is configured to generate an initial input fingerprint image when the finger contacts with a biometric recognition area of the display unit, acquire a converted fingerprint image by converting the initial input fingerprint image in a pre-determined manner to reveal a characteristic of a pattern, included within the initial input fingerprint image, corresponding to a pattern signal reflected from at least a part of the display unit, select a pattern removal fingerprint image, if the learned pattern image is stored in the memory, from the learned pattern image based on similarity calculated between the converted fingerprint image and a converted reference image acquired by converting the learned pattern image in a pre-determined manner and acquire a final input fingerprint image in which the pattern is removed from the initial input fingerprint image by using the selected pattern removal fingerprint image.

In accordance with another aspect of the present disclosure, there is provided a non-transitory computer-readable storage medium storing a computer program including computer executable instructions, wherein the instructions, when executed by a processor, cause the processor to perform a method comprises recognizing a finger of an user through a sensor included in the apparatus to generate an initial input fingerprint image when the finger contacts with a biometric recognition area of the display unit of an electronic device, acquiring a converted fingerprint image by converting the initial input fingerprint image in a pre-determined manner to reveal a characteristic of a pattern, included within the initial input fingerprint image, corresponding to a pattern signal reflected from at least a part of the display unit, selecting a pattern removal fingerprint image, if a learned pattern image is stored in a memory, from the learned pattern image based on similarity calculated between the converted fingerprint image and a converted reference image acquired by converting the learned pattern image in the pre-determined manner and acquiring a final input fingerprint image in which the pattern is removed from the initial input fingerprint image by using the selected pattern removal fingerprint image.

According to an embodiment of the present disclosure, the initial input fingerprint image including the pattern corresponding to the pattern signal reflected from the TFT at a position changed by various factors such as fingerprint condition of a user's finger, intensity of a user's finger pressure, and external temperature may be learned, and the final fingerprint image in which the pattern is removed from the initial input fingerprint image may be acquired by using the learned pattern image.

BRIEF DESCRIPTION OF THE DRAWINGS

FIG. 7 shows a flowchart illustrating a process of a fingerprint image acquisition method according to an embodiment of the present disclosure.

DETAILED DESCRIPTION

The advantages and features of exemplary embodiments of the present disclosure and methods of accomplishing them will be clearly understood from the following description of the embodiments taken in conjunction with the accompanying drawings. However, the present disclosure is not limited to those embodiments and is implemented in various forms. It is noted that the embodiments are provided to make a full disclosure and also to allow those skilled in the art to know the full scope of the present disclosure.

In the following description, well-known functions and/or configurations will not be described in detail if they would unnecessarily obscure the features of the disclosure. Further, the terms to be described below are defined in consideration of their functions in the embodiments of the disclosure and vary depending on a user's or operator's intention or practice. Accordingly, the definition is made on a basis of the content throughout the present disclosure.

Figure 1:
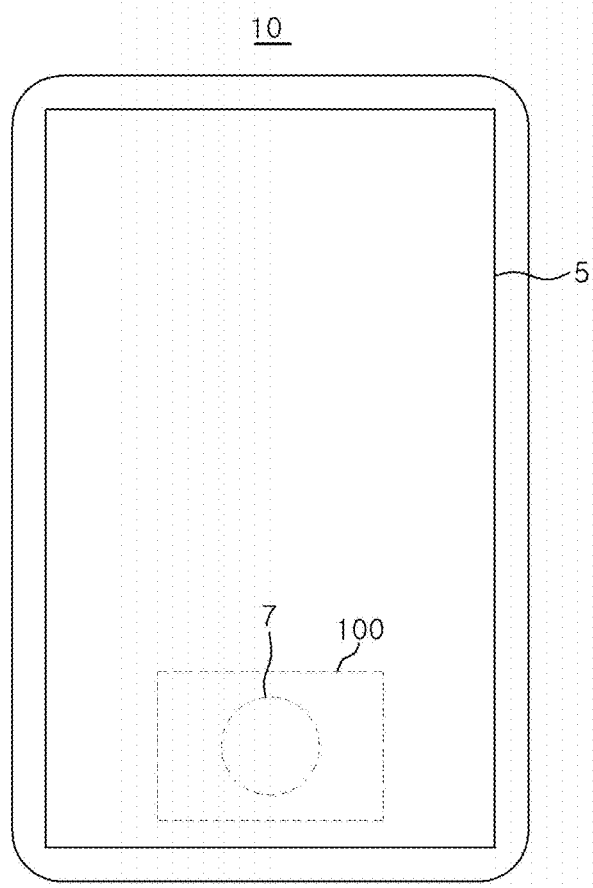
FIG. 1 shows a diagram illustrating a fingerprint image acquisition apparatus according to an embodiment of the present disclosure.
Figure 2:
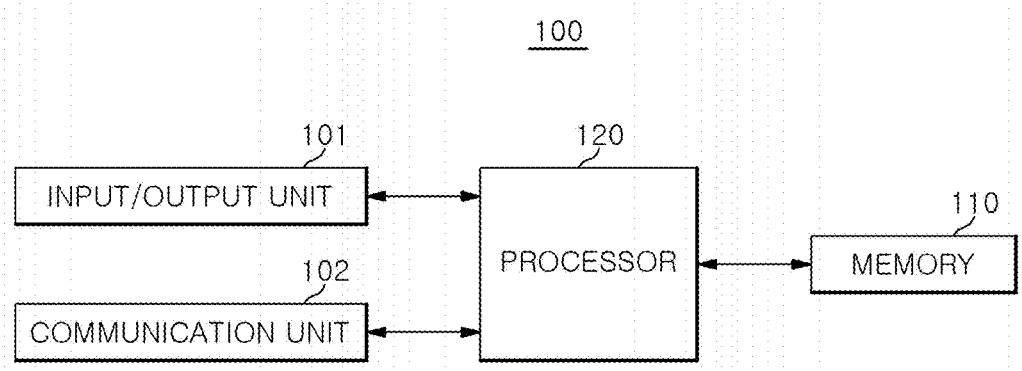
FIG. 2 shows a block diagram illustrating components of a fingerprint image acquisition apparatus according to an embodiment of the present disclosure.
Figure 3:
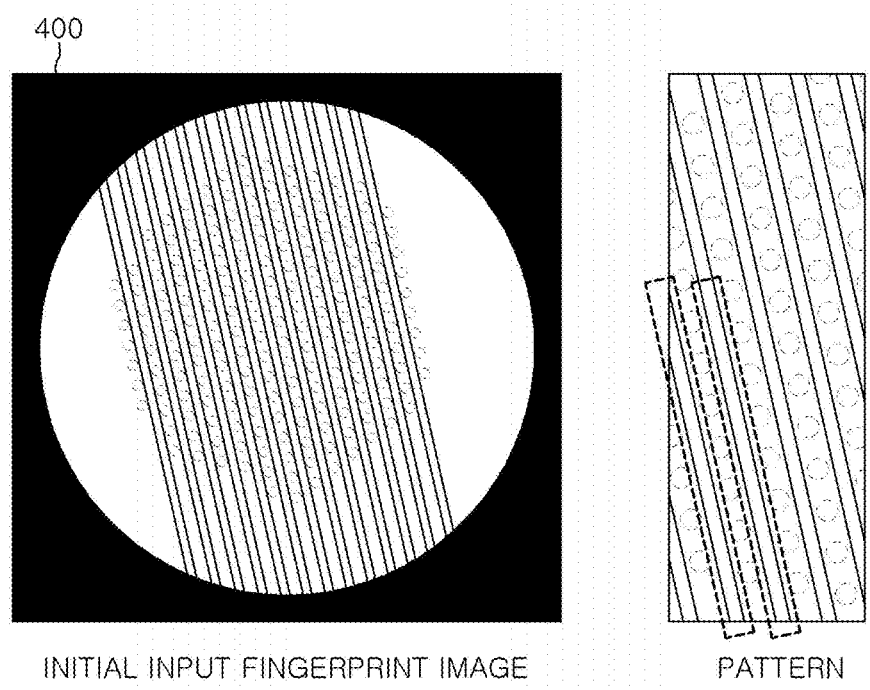
FIG. 3 shows a diagram illustrating a pattern included on an initial input fingerprint image acquired by a fingerprint image acquisition apparatus according to an embodiment of the present disclosure.
Figure 4:
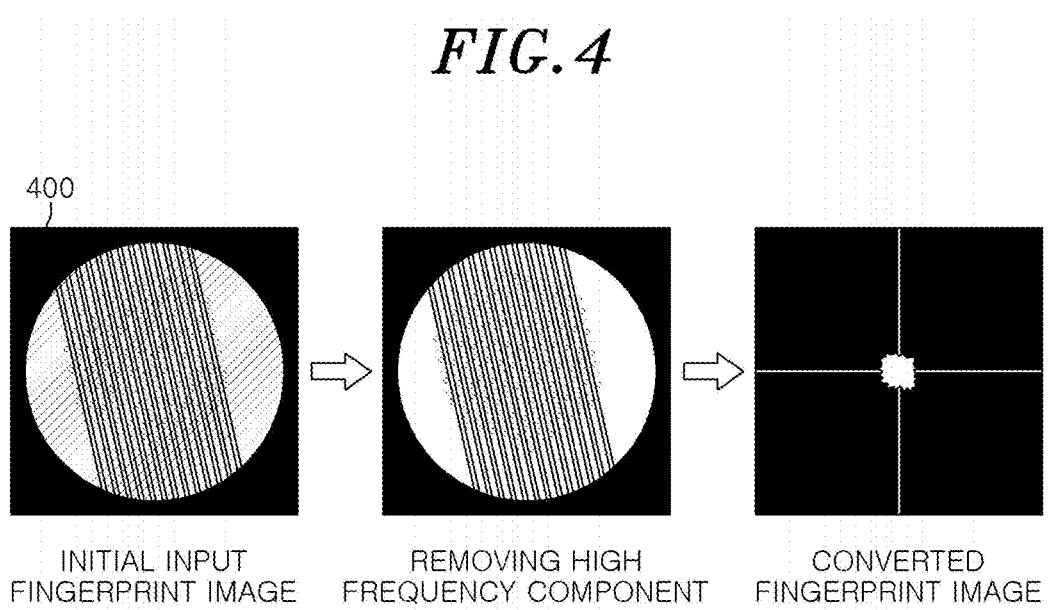
FIG. 4 shows a diagram illustrating acquisition of a converted fingerprint image by a fingerprint image acquisition apparatus according to an embodiment of the present disclosure.
Figure 5:
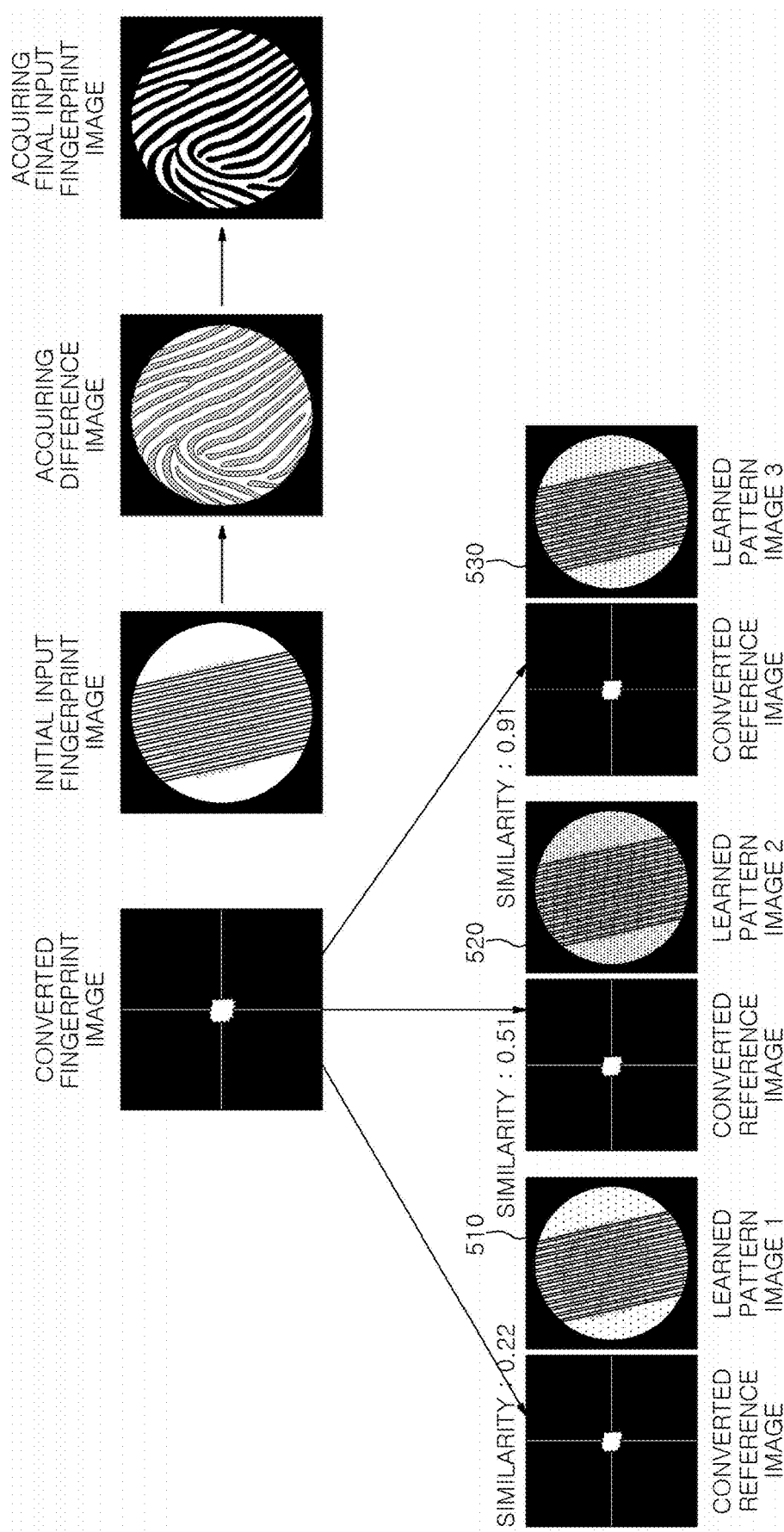
FIG. 5 shows a diagram illustrating a method in which a fingerprint image acquisition apparatus selects a pattern removal fingerprint image according to an embodiment of the present disclosure.
Figure 6:
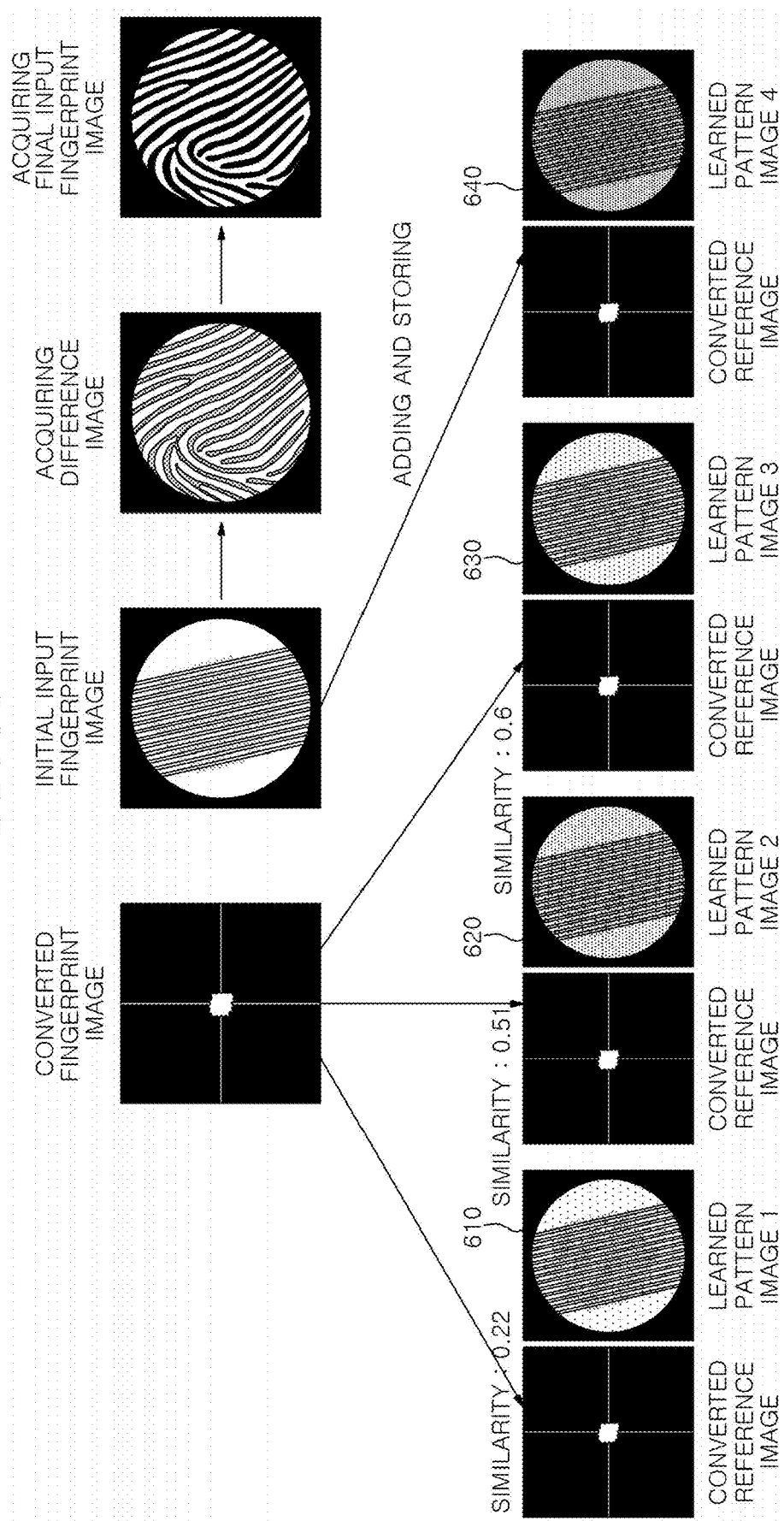
FIG. 6 shows a diagram illustrating a method in which a fingerprint image acquisition apparatus selects a pattern removal fingerprint image according to another embodiment of the present disclosure.

FIG. 1 shows a diagram illustrating a fingerprint image acquisition apparatus 100 according to an embodiment of the present disclosure, FIG. 2 shows a block diagram illustrating components of the fingerprint image acquisition apparatus 100 according to an embodiment of the present disclosure, FIG. 3 shows a diagram illustrating a pattern included on an initial input fingerprint image acquired by the fingerprint image acquisition apparatus 100 according to an embodiment of the present disclosure, FIG. 4 shows a diagram illustrating acquisition of a converted fingerprint image by the fingerprint image acquisition apparatus 100 according to an embodiment of the present disclosure, FIG. 5 shows a diagram illustrating a method in which the fingerprint image acquisition apparatus 100 selects a pattern removal fingerprint image according to an embodiment of the present disclosure, and FIG. 6 shows a diagram illustrating a method in which the fingerprint image acquisition apparatus 100 selects the pattern removal fingerprint image according to another embodiment of the present disclosure.

First, referring to FIG. 1, the fingerprint image acquisition apparatus 100 according to an embodiment of the present disclosure may be positioned within a display unit 5 of an electronic device 10. For example, the fingerprint image acquisition apparatus 100 may be positioned on a rear side of the display unit 5.

Herein, the electronic device 10 may be implemented as various types of devices such as a mobile terminal, a mobile phone, a TV, a tablet PC, a PDA, an electronic picture frame, a navigation device, a wearable device such as a smart watch, and the like and the display unit 5 may be implemented as various types of displays such as a Liquid Crystal Display LCD) or a touch screen.

According to an embodiment, the fingerprint image acquisition apparatus 100 may be positioned on a rear side of a biometric recognition area 7 included in the display unit 5 of the electronic device 10, but a position of the fingerprint image acquisition apparatus 100 is not limited thereto.

More specifically, the fingerprint image acquisition apparatus 100 will be described in detail with reference to FIG. 2.

Referring to FIG. 2, the fingerprint image acquisition apparatus 100 according to an embodiment of the present disclosure may include an input/output unit 101, a communication unit 102, a memory 110, a sensor and/or a processor 120.

The input/output unit 101 may, for example, transmit a command or data input from a user or an external device to other component(s) of the fingerprint image acquisition apparatus 100 according to an embodiment, or may output, to the user or the external device, a command or data received from other component(s) of the fingerprint image acquisition apparatus 100 according to an embodiment.

For example, the input/output unit 101 may receive a sensed signal from the sensor.

The communication unit 102 may support establishing a wired or wireless communication channel between the fingerprint image acquisition apparatus 100 and the external device and performing communication through the established communication channel.

The memory 110 may store various data, for example, software (for example, a program) and input data or output data for commands related to the software, that is used by at least one component of the fingerprint image acquisition apparatus 100 (for example, the processor 120, the input/output unit 101, and/or the communication unit 102). The memory 110 may include a volatile memory or a non-volatile memory.

According to an embodiment, the memory 110 may store a learned pattern images, for example, the memory 110 may store each learned pattern image in pre-determined number of classes. The learned pattern image may include an image of a fake finger which does not have fingerprint.

Herein, the learned pattern image may include an image in which an initial input fingerprint image initially acquired after the fingerprint image acquisition apparatus 100 is produced in a manufacturing step is learned, and may be an image learned based on a pattern of the initial input fingerprint image. On the other hand, the learned pattern image stored in the memory 110 may include a fingerprint region and a pattern, but before determining whether to store an input fingerprint image as a pattern image, whether to store the input fingerprint image based on a converted fingerprint image obtained by converting the input fingerprint image in a pre-determined manner, that is, based on the image in which the pattern is more clearly expressed is determined and then the input fingerprint image may be stored as the learned pattern image if it is determined that there is a need for storing.

Herein, the initial input fingerprint image is fingerprint, initially captured, of a user.

The processor 120 (also referred to a controller, a control device, or a control circuit) may control at least one other component, connected to the processor 120, of the fingerprint image acquisition apparatus 100 (for example, a hardware component (for example, the input/output unit 101, the communication unit 102 and/or the memory 110) or a software component), and may perform various data processing and operations.

Further, the processor 120 may load commands or data received from at least one of other components into the volatile memory to process, and may store various data in the non-volatile memory.

To this end, the processor 120 may be implemented as a dedicated processor (for example, an embedded processor) for performing the corresponding operations or a generic-purpose processor (for example, a CPU, an application processor, or a Micro Controller Unit (MCU), etc.) capable of performing the corresponding operations by executing one or more software programs stored in a memory device.

More specifically, the processor 120 may generate the initial input fingerprint image based on the user's body recognized through the sensor when the body contacts with the biometric recognition area 7 of the display unit 5. For example, the body may be a finger of the user.

According to an embodiment, the processor 120 may generate the initial input fingerprint image based on a signal sensed by the sensor as the user's finger contacts with the biometric recognition area 7 of the display unit 5 of the electronic device 10.

Herein, the sensor may include an optical sensor, and the optical sensor may be an under-screen optical sensor positioned under the display unit 5 of the electronic device 10, but is not limited thereto.

On the other hand, the initial input fingerprint image may include a pattern corresponding to a pattern signal reflected from a Thin Film Transistor (TFT) among OLED display circuits included in the biometric recognition area 7 in addition to the user's fingerprint region. The pattern will be described in detail referring to FIG. 3.

Referring to FIG. 3, an initial input fingerprint image acquired by the fingerprint image acquisition apparatus 100 according to an embodiment of the present disclosure may include a uniform pattern reflected from a TFT.

Specifically, the TFT is uniformly arranged in a part of the display unit 5 of the electronic device 10 (for example, the biometric recognition area 7), and the initial input fingerprint image acquired by the fingerprint image acquisition apparatus 100 according to an embodiment of the present disclosure may include a pattern corresponding to a pattern signal reflected from the uniformly arranged TFT in addition to a user's fingerprint region.

At this time, the processor 120 may convert the initial input fingerprint image in a pre-determined manner to reveal characteristics of the pattern, included on the initial input fingerprint image, corresponding to the pattern signal reflected by at least a part of the display unit 5, thereby acquiring a converted fingerprint image.

Referring to FIG. 4, according to an embodiment, the processor 120 may Fourier-transform the initial input fingerprint image 400 in a frequency domain of the Fourier-transformed initial input fingerprint image, and may remove high frequency components in the initial input fingerprint image, thereby acquiring a converted fingerprint image in which characteristics of a pattern in the initial input fingerprint image are revealed. However, a method of acquiring the converted fingerprint image by the processor 120 is not limited thereto.

Thereafter, if a learned pattern image is previously stored in the memory 110, the processor 120 may select a pattern removal fingerprint image from the learned pattern image based on similarity calculated between the converted fingerprint image and a converted reference image acquired by converting the learned pattern image in a pre-determined manner.

Herein, the pattern removal fingerprint image may be an image among a plurality of the learned pattern images. The converted reference image may be an image acquired from the learned pattern image by using Fourier-transform.

According to an embodiment, the processor 120 may calculate each similarity between the converted fingerprint image and each converted reference image acquired by converting the plurality of the learned pattern images previously stored in the memory 110 in the pre-determined manner, and may select a learned pattern image with the largest similarity as the pattern removal fingerprint image.

Referring to FIG. 5, the processor 120 may acquire a converted reference image for each of a plurality of learned pattern images 510, 520, and 530 stored in the memory 110, and may calculate similarity between each converted reference image and a converted fingerprint image. In this case, if the similarity between the converted fingerprint image and the converted reference image of each of the plurality of the learned pattern images 510, 520, 530 is 0.22, 0.51, and 0.91, the learned pattern image 530 having the similarity of 0.91, which is the largest similarity among the calculated similarity, may be selected as a pattern removal fingerprint image.

According to another embodiment, the processor 120 may calculate similarity between the converted fingerprint image and a converted reference image acquired by converting, in a pre-determined manner, a most recently used learned pattern image as a previously used pattern removal fingerprint image among a plurality of learned pattern images, and may select the most recently used learned pattern image as the pattern removal fingerprint image if the calculated similarity exceeds a pre-determined threshold value.

For example, if the similarity between the converted fingerprint image and the converted reference image acquired by converting, in the pre-determined manner, the learned pattern image 530 most recently used among the plurality of the learned pattern images is 0.91, and the pre-determined threshold value is 0.7, the processor 120 may select the most recently used learned pattern image as the pattern removal fingerprint image.

However, if the similarity between the converted fingerprint image and the converted reference image acquired by converting the most recently used learned pattern image 530 in the pre-determined manner is 0.91, and the pre-determined threshold value is 0.95, the processor 120 may not select the most recently used learned pattern image as the pattern removal fingerprint image. The processor 120 may acquire each converted reference image by converting, in the pre-determined manner, learned pattern images other than the most recently used learned pattern image among the plurality of the learned pattern images, and may calculate a plurality of similarity between the converted reference images and the converted fingerprint image. Thereafter, the processor 120 may select, as the pattern removal fingerprint image, a learned pattern image having the largest similarity among the plurality of similarity and the similarity between the converted fingerprint image and the converted reference image acquired by converting the recently used learned pattern image in the pre-determined manner.

In other words, if a plurality of similarity between the converted fingerprint image and each of the converted reference images acquired by converting the learned pattern images other than the recently used learned pattern image in the pre-determined manner is smaller than the similarity between the converted fingerprint image and the converted reference image acquired by converting the recently used learned pattern image in the pre-determined manner, the processor 120 may select the recently used learned pattern image as the pattern removal fingerprint image. Further, if one of a plurality of similarity between the converted fingerprint image and each of the converted reference images acquired by converting the learned pattern images other than the recently used learned pattern image in the pre-determined manner is larger than the similarity between the converted fingerprint image and the converted reference image acquired by converting the recently used learned pattern image in the pre-determined manner, the processor 120 may select the corresponding learned pattern image as the pattern removal fingerprint image.

The processor 120 may acquire a final input fingerprint image in which a pattern is removed from an initial input fingerprint image by using the selected pattern removal fingerprint image.

According to an embodiment, the processor 120 may acquire a difference image between the pattern removal fingerprint images and the initial input fingerprint image, and may acquire the final input fingerprint image in which the pattern is removed from the initial input fingerprint image by performing a pre-determined image processing for the acquired difference image.

Herein, the pre-determined image processing may be passing the difference image through a low-pass filter, or passing the difference image through a band-pass filter, but it is not limited thereto.

In addition, the processor 120 may perform user authentication based on a result of comparing the final input fingerprint image and a user authentication fingerprint image in which a user's fingerprint image is stored.

On the other hand, the processor 120 may reflect, based on a result of comparing a pre-determined threshold value and the similarity between the converted fingerprint image and the converted reference image acquired by converting the pre-stored learned pattern image in a pre-determined manner, an initial input fingerprint image onto the pre-stored learned pattern image.

According to an embodiment, if the calculated similarity between the converted fingerprint image and the converted reference image acquired by converting the pre-stored learned pattern image in the pre-determined manner exceeds the threshold value, the processor 120 may accumulate pixel values corresponding to the initial input fingerprint image on the learned pattern image selected as the pattern removal fingerprint image.

At this time, if definition of a fingerprint region included on the initial input fingerprint image is greater than a pre-determined definition, the processor 120 may lower the definition of the fingerprint region included on the initial input fingerprint image by a pre-determined amount, and then may accumulate the pixel values of the initial input fingerprint image in which the definition of the fingerprint region is lowered on the learned pattern image selected as the pattern removal fingerprint image.

Specifically, the processor 120 may lower the definition of the fingerprint region to lower the definition of fingerprint before accumulating the pixel values of the initial input fingerprint image on the learned pattern image since the fingerprint having high definition may effect on the difference image.

On the other hand if definition of the fingerprint region is smaller than or equal to the pre-determined definition, the processor 120 may accumulate the pixel values of the initial input fingerprint image on the learned pattern image without lowering the definition of the fingerprint region. According to another embodiment, if the calculated similarity between the converted fingerprint image and the converted reference image acquired by converting the pre-stored learned pattern image in the pre-determined manner is equal to or smaller than the pre-determined threshold value, the processor 120 may add and store the initial input fingerprint image as a learned pattern image.

For example, referring to FIG. 6, the processor 120 may acquire a converted reference image for each of a plurality of learned pattern images 610, 620, and 630 stored in the memory 110, and may calculate similarity between each of the converted reference images and a converted fingerprint image. At this time, if the similarity between the converted fingerprint image and the converted reference images for the plurality of the learned pattern images 610, 620, 630 is 0.22, 0.51, and 0.6 respectively and a pre-determined threshold value is 0.7, the processor 120 may add and store the initial input fingerprint image as a learned pattern image 640 because all of a plurality of the calculated similarity does not exceed the pre-determined threshold value.

At this time, if definition of the fingerprint region included on the initial input fingerprint image is greater than a pre-determined definition, the processor 120 may lower the definition of the fingerprint region included on the initial input fingerprint image by a pre-determined amount, and then may add and store the initial input fingerprint image in which the definition of the fingerprint region is lowered as a learned pattern image.

On the other hand if definition of the fingerprint region is smaller than or equal to the pre-determined definition, the processor 120 may add and store the initial input fingerprint image as a learned pattern image without lowering the definition of the fingerprint region.

Alternatively, the processor 120 may calculate the similarity between the converted fingerprint image and each converted reference image acquired by converting a plurality of the learned pattern images in the pre-determined manner to select a learned pattern image having the largest similarity as the pattern removal fingerprint image. However, if the plurality of the similarity are smaller than or equal to the pre-determined threshold value and pre-determined number of a plurality of learned pattern images are already stored in the memory 110, the processor 120 may remove the learned pattern image having the largest similarity among the plurality of the similarity, and add and store the initial input fingerprint image to store the learned patter images having various conditions which are different from conditions of the plurality of learned pattern images already stored in the memory 110.

Accordingly, because the initial input fingerprint image may be reflected (for example, accumulated to learn or added to learn) on the learned pattern image based on a result of comparing the pre-determined threshold value and the calculated similarity between the converted fingerprint image and the converted reference image acquired by converting the pre-stored learned pattern image in the pre-determined manner, the fingerprint image acquisition apparatus 100 according to an embodiment of the present disclosure may reflect a pattern corresponding to a pattern signal reflected from a TFT which is changed according to an environment on the pre-stored learned pattern image.

FIG. 7 shows a flowchart illustrating a process of a fingerprint image acquisition method according to an embodiment of the present disclosure. The fingerprint image acquisition method of FIG. 7 may be performed by the fingerprint image acquisition apparatus 100 of FIG. 2. In addition, the fingerprint image acquisition method illustrated in FIG. 7 is just an example.

Referring to FIG. 7, in a step S100, the sensor may recognize the finger of the user to generate an initial input fingerprint image when the finger contacts the biometric recognition area 7 of the display unit 5.

Thereafter, in a step S200, the processor 120 may acquire a converted fingerprint image by converting the initial input fingerprint image in a pre-determined manner so that characteristics of a pattern, included on the initial input fingerprint image, corresponding to a pattern signal reflected from at least a part of the display unit 5 are revealed.

Thereafter, in a step S300, if there is a pre-stored learned pattern image, the processor 120 may select a pattern removal fingerprint image from the learned pattern image based on similarity calculated between the converted fingerprint image and a converted reference image acquired by converting the learned pattern image in a pre-determined manner.

Thereafter, in a step S400, the processor 120 may acquire a final input fingerprint image in which the pattern is removed from the initial input fingerprint image by using the selected pattern removal fingerprint image.

At this time, before performing the step S400 or after performing the step S400, the processor 120 may reflect, based on a result of comparing a pre-determined threshold value and the calculated similarity between the converted fingerprint image and the converted reference image acquired by converting the learned pattern image pre-stored in the memory 110 in the pre-determined manner, the initial input fingerprint image on the learned pattern image.

In addition, after performing the step S400, the processor 120 may perform user authentication based on a result of comparing the final input fingerprint image and a user authentication fingerprint image in which the user's fingerprint image is stored.

As described above, according to an embodiment of the present disclosure, an initial input fingerprint image including the pattern corresponding to the pattern signal reflected from a TFT at a position changed by various factors such as the fingerprint condition of the user's finger, the intensity of the user's finger pressure, and the external temperature, etc. may be learned, and the final fingerprint image in which the pattern is removed from the initial input fingerprint image may be acquired by using the learned pattern image.

Combinations of steps in the flowcharts of the present disclosure can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the steps of the flowchart.

These computer program instructions may also be stored in a computer usable or computer readable memory that can direct a computer or other programmable data processing apparatuses to function in a particular manner, such that the instructions stored in the computer usable or computer readable medium can produce an article of manufacture including instructions which implement the function specified in the steps of the flowcharts.

The computer program instructions may also be loaded onto a computer or other programmable data processing apparatuses to cause a series of operational steps to be performed on the computer or other programmable apparatuses to produce a computer implemented process such that the instructions which execute on the computer or other programmable apparatuses provide processes for implementing the functions specified in the steps of the flowcharts.

Each step in the flowchart may represent a module, segment, or portion of code, which comprises one or more executable instructions for implementing the specified logical function(s). It should also be noted that, in some alternative implementations, the functions noted in the step may occur out of the order noted in the figures. For example, two steps shown in succession may, in fact, be executed substantially concurrently, or the steps may sometimes be executed in the reverse order, depending upon the functionality involved.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A method for acquiring a fingerprint image through a fingerprint image acquisition apparatus provided within a display unit of an electronic device, the method comprising:
   recognizing a finger of a user through a sensor included in the apparatus to generate an initial input fingerprint image when the finger contacts with a biometric recognition area of the display unit;
   acquiring a converted fingerprint image by converting the initial input fingerprint image in a pre-determined manner to reveal a characteristic of a pattern, included within the initial input fingerprint image, corresponding to a pattern signal reflected from at least a part of the display unit;
   selecting a pattern removal fingerprint image, if a learned pattern image is stored in a memory, from the learned pattern image based on similarity calculated between the converted fingerprint image and a converted reference image acquired by converting the learned pattern image in a pre-determined manner; and
   acquiring a final input fingerprint image in which the pattern is removed from the initial input fingerprint image by using the selected pattern removal fingerprint image.

2. The method of claim 1, wherein a plurality of learned pattern images are stored in the memory, and
   the selecting of the pattern removal fingerprint image includes:
   calculating each similarity between the converted fingerprint image and each of converted reference images acquired by converting the plurality of the learned pattern images in the pre-determined manner; and
   selecting a learned pattern image having largest similarity with the converted fingerprint image as the pattern removal fingerprint image.

3. The method of claim 1, wherein a plurality of learned pattern images are stored in the memory, and
   the selecting of the pattern removal fingerprint image includes:

calculating similarity between the converted fingerprint image and a converted reference image acquired by converting a most recently used learned pattern image as a previously used pattern removal fingerprint image among the plurality of the learned pattern images; and
selecting the most recently used learned pattern image as the pattern removal fingerprint image if the calculated similarity exceeds a pre-determined threshold value.

4. The method of claim 1, wherein a plurality of learned pattern images are stored in the memory, and
the selecting of the pattern removal fingerprint image includes:
calculating similarity between the converted fingerprint image and a converted reference image acquired by converting a most recently used learned pattern image as a previously used pattern removal fingerprint image among the plurality of the learned pattern images;
calculating a plurality of similarity between the converted fingerprint image and each converted reference image acquired by converting learned pattern images other than the most recently used learned pattern image among the plurality of the learned pattern images if the calculated similarity is smaller than a pre-determined threshold value; and
selecting a learned pattern image having the largest similarity among the learned pattern images as the pattern removal fingerprint image.

5. The method of claim 1, the method further comprising:
reflecting the initial input fingerprint image on the learned pattern image based on a result of comparing a pre-determined threshold value and the similarity between the converted fingerprint image and the converted reference image acquired by converting the learned pattern image in the pre-determined manner.

6. The method of claim 5, wherein the reflecting of the initial input fingerprint image includes accumulating pixel values corresponding to the initial input fingerprint image on the learned pattern image selected as the pattern removal fingerprint image.

7. The method of claim 6, wherein the initial input fingerprint image further includes a fingerprint region, and
the accumulating of the pixel values includes:
lowering definition of the fingerprint region included on the initial input fingerprint image by a pre-determined amount if the definition of the fingerprint region included on the initial input fingerprint image is greater than pre-determined definition; and
accumulating the pixel values of the initial input fingerprint image in which the definition of the fingerprint region is lowered on the learned pattern image selected as the pattern removal fingerprint image.

8. The method of claim 6, wherein the initial input fingerprint image further includes a fingerprint region, and
wherein the pixel values are accumulated on the learned pattern image selected as the pattern removal fingerprint image without lowering definition of the fingerprint region if definition of the fingerprint region is smaller than or equal to a pre-determined definition.

9. The method of claim 5, wherein the reflecting of the initial input fingerprint image includes adding and storing the initial input fingerprint image as the learned pattern image if the calculated similarity is smaller than or equal to the pre-determined threshold value.

10. The method of claim 9, wherein the initial input fingerprint image further includes a fingerprint region, and
the adding and storing of the initial input fingerprint image includes:
lowering definition of the fingerprint region included on the initial input fingerprint image by a pre-determined amount if the definition of the fingerprint region included on the initial input fingerprint image is greater than pre-determined definition; and
adding and storing the initial input fingerprint image in which the definition of the fingerprint region is lowered as the learned pattern image.

11. The method of claim 9, wherein the initial input fingerprint image further includes a fingerprint region, and
wherein the initial input fingerprint image is added and stored as a learned pattern image without lowering definition of the fingerprint region if the definition of the fingerprint region is smaller than or equal to a pre-determined definition.

12. The method of claim 5, wherein a plurality of learned pattern images are stored in the memory,
the reflecting of the initial input fingerprint image includes:
calculating each similarity between the converted fingerprint image and each converted reference image acquired by converting the plurality of the learned pattern images in the pre-determined manner;
removing the learned pattern image having the largest similarity if a plurality of the similarity are smaller than or equal to the threshold value; and
adding and storing the initial input fingerprint image as the learned pattern image.

13. The method of claim 1, wherein the acquiring of the final input fingerprint image includes:
acquiring a difference image between the initial input fingerprint image and the pattern removal fingerprint image by using the selected pattern removal fingerprint image; and
acquiring the final input fingerprint image in which the pattern is removed from the initial input fingerprint image by performing a pre-determined image processing for the difference image.

14. The method of claim 13, wherein the pre-determined image processing is performed by using Low-pass filter or Band-pass filter.

15. The method of claim 1, wherein the pre-determined manner to acquire the converted fingerprint image includes:
converting, by using Fourier Transform, the initial input fingerprint image in a frequency domain of the Fourier transformed initial input fingerprint image; and
removing a high frequency component from the initial input fingerprint image.

16. The method of claim 1, wherein the biometric recognition area includes an OLED display circuit,
the pattern signal is a signal reflected from at least a part of the OLED display circuit, and
the OLED display circuit includes a Thin Film Transistor (TFT).

17. The method of claim 1, wherein the sensor includes an optical sensor, and
the display unit includes a touch screen.

18. The method of claim 1, further comprising:
performing user authentication based on a result of comparing the final input fingerprint image and a user authentication fingerprint image in which a fingerprint image of the user is stored.

19. A fingerprint image acquisition apparatus provided within a display unit of an electronic device, the apparatus comprising:
a memory configured to store a learned pattern image;
a sensor configured to recognize a finger of a user; and a processor electrically connected to the memory, wherein the processor is configured to:

generate an initial input fingerprint image when the finger contacts with a biometric recognition area of the display unit;

acquire a converted fingerprint image by converting the initial input fingerprint image in a pre-determined manner to reveal a characteristic of a pattern, included within the initial input fingerprint image, corresponding to a pattern signal reflected from at least a part of the display unit;

select a pattern removal fingerprint image, if the learned pattern image is stored in the memory, from the learned pattern image based on similarity calculated between the converted fingerprint image and a converted reference image acquired by converting the learned pattern image in a pre-determined manner; and acquire a final input fingerprint image in which the pattern is removed from the initial input fingerprint image by using the selected pattern removal fingerprint image.

20. A non-transitory computer-readable storage medium storing a computer program including computer executable instructions, wherein the instructions, when executed by a processor, cause the processor to perform a method comprising:

recognizing a finger of a user through a sensor included in the apparatus to generate an initial input fingerprint image when the finger contacts with a biometric recognition area of the display unit of an electronic device;

acquiring a converted fingerprint image by converting the initial input fingerprint image in a pre-determined manner to reveal a characteristic of a pattern, included within the initial input fingerprint image, corresponding to a pattern signal reflected from at least a part of the display unit;

selecting a pattern removal fingerprint image, if a learned pattern image is stored in a memory, from the learned pattern image based on similarity calculated between the converted fingerprint image and a converted reference image acquired by converting the learned pattern image in the pre-determined manner; and acquiring a final input fingerprint image in which the pattern is removed from the initial input fingerprint image by using the selected pattern removal fingerprint image.

* * * * *